(12) United States Patent
Shiang et al.

(10) Patent No.: US 7,768,210 B2
(45) Date of Patent: Aug. 3, 2010

(54) HYBRID ELECTROLUMINESCENT DEVICES

(75) Inventors: Joseph John Shiang, Niskayuna, NY (US); Anil Raj Duggal, Niskayuna, NY (US); Joseph Darryl Michael, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 238 days.

(21) Appl. No.: 11/753,770

(22) Filed: May 25, 2007

(65) Prior Publication Data

US 2007/0222397 A1 Sep. 27, 2007

Related U.S. Application Data

(63) Continuation-in-part of application No. 11/347,089, filed on Feb. 3, 2006, now Pat. No. 7,576,496, which is a continuation-in-part of application No. 10/208,543, filed on Jul. 31, 2002, now abandoned, which is a continuation-in-part of application No. 09/712,474, filed on Nov. 14, 2000, now Pat. No. 6,800,999, which is a continuation-in-part of application No. 09/469,702, filed on Dec. 22, 1999, now Pat. No. 6,566,808.

(51) Int. Cl.
*F21S 4/00* (2006.01)
(52) U.S. Cl. .................... 315/185 R; 315/185 S
(58) Field of Classification Search ............. 315/312, 315/192, 185 R, 200 R; 362/800; 345/76, 345/77, 82, 45, 46
See application file for complete search history.

(56) References Cited

U.S. PATENT DOCUMENTS

| | | | | |
|---|---|---|---|---|
| 5,552,678 | A * | 9/1996 | Tang et al. | 315/169.3 |
| 5,644,369 | A * | 7/1997 | Jachimowicz et al. | 349/10 |
| 5,670,792 | A * | 9/1997 | Utsugi et al. | 257/59 |
| 5,719,589 | A * | 2/1998 | Norman et al. | 345/82 |
| 5,756,224 | A * | 5/1998 | Borner et al. | 428/690 |
| 5,783,292 | A * | 7/1998 | Tokito et al. | 428/212 |
| 5,923,308 | A * | 7/1999 | Wei et al. | 345/44 |
| 5,935,720 | A * | 8/1999 | Chen et al. | 428/690 |
| 5,977,611 | A * | 11/1999 | Sittig et al. | 257/603 |
| 6,023,371 | A * | 2/2000 | Onitsuka et al. | 359/620 |
| 6,566,808 | B1 | 5/2003 | Duggal et al. | |
| 6,720,570 | B2 | 4/2004 | Lee et al. | |
| 6,734,467 | B2 | 5/2004 | Schlereth et al. | |
| 6,800,999 | B1 | 10/2004 | Duggal et al. | |
| 7,198,533 | B2 | 4/2007 | Duggal et al. | |

OTHER PUBLICATIONS

Suzuki et al., "Near-Ultraviolet Electroluminescence From Polysilanes", Elsevier, Thin Solid Films, vol. 331, pp. 64-70, 1998.
Mitschke et al., "The Electroluminescence of Organic Materials", J. Mater. Chem., vol. 10, pp. 1471-1507, 2000.
Friend, "Optical Investigations of Conjugated Polymers", Journal of Molecular Electronics, vol. 4, pp. 37-46, 1988.

* cited by examiner

*Primary Examiner*—Douglas W Owens
*Assistant Examiner*—Minh D A
(74) *Attorney, Agent, or Firm*—Mary Louise Gioeni

(57) ABSTRACT

A hybrid electroluminescent (EL) device comprises at least one inorganic diode element and at least one organic EL element that are electrically connected in series. The absolute value of the breakdown voltage of the inorganic diode element is greater than the absolute value of the maximum reverse bias voltage across the series. The inorganic diode element can be a power diode, a Schottky barrier diode, or a light-emitting diode.

21 Claims, 2 Drawing Sheets

HYBRID ELECTROLUMINESCENT DEVICES

CROSS-REFERENCE TO RELATED APPLICATIONS

This application is a continuation-in-part of U.S. application Ser. No. 11/347,089, filed on Feb. 3, 2006 now U.S. Pat. No. 7,576,496, which is a continuation-in-part of U.S. application Ser. No. 10/208,543, filed on Jul. 31, 2002 now abandoned, which is a continuation-in-part of U.S. application Ser. No. 09/712,474, filed Nov. 14, 2000 now U.S. Pat. No. 6,800,999, which is a continuation-in-part of U.S. application Ser. No. 09/469,702 filed Dec. 22, 1999 now U.S. Pat. No. 6,566,808; the entire contents of which are hereby incorporated by reference.

STATEMENT REGARDING FEDERALLY SPONSORED RESEARCH

This invention was first conceived or reduced to practice in the performance of work under contract DE-FC26-00NT40989 awarded by the United States Department of Energy. The United States of America may have certain rights to this invention.

BACKGROUND OF THE INVENTION

The present invention relates to electroluminescent devices. In particular, the present invention relates to such devices that comprise organic electroluminescent materials.

Electroluminescent ("EL") devices, which convert electrical energy to electromagnetic energy, may be classified as either organic or inorganic and are well known in graphic display and imaging art. EL devices have been produced in different shapes for many applications. Inorganic EL devices comprising inorganic semiconducting materials have gained acceptance in many applications in recent years. However, they typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent organic semiconductor layers are sandwiched between a cathode and an anode. The organic semiconductor layers may be either hole (positive charge)-injecting or electron (negative charge)-injecting layers and also comprise organic materials. The material for the light-emitting layer may be selected from many organic EL materials that emit light having different wavelengths. The light-emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometers. Although OELDs exhibit electrical characteristics much like those of a diode, and thus are expected to be operated with an alternating current ("AC") power supply, they do allow various small leakage currents in the reverse bias direction because of imperfections introduced during their manufacture. Such current leakage through imperfect devices in a series of OELDs can lead to a very high reverse voltage across better OELDs that do not admit reverse leakage current, and thus to a rapid failure of these better devices.

Therefore, there is a need to provide more robust systems of OELDs that can tolerate some reverse leakage current without shortening the life of these devices.

BRIEF DESCRIPTION OF THE INVENTION

In general, the present invention provides a hybrid electroluminescent device that comprises at least one organic EL element and at least one inorganic diode element that are electrically connected in series.

In one aspect of the present invention, the hybrid EL device comprises a plurality of organic EL elements and one inorganic diode element that are electrically connected in series.

In another aspect of the present invention, each of the plurality of organic EL elements comprises an organic EL material disposed between a pair of electrically conducting materials.

In another aspect, the inorganic diode element is an inorganic light-emitting diode.

In still another aspect, the hybrid EL device is activated with an AC power.

In still another aspect of the present invention, a method of making an EL device comprises: (a) providing a plurality of organic EL elements that are electrically connected in series; and (b) connecting an inorganic diode electrically in series to the plurality of organic EL elements.

In still another aspect of the present invention, a method for generating light comprises providing an AC power to a plurality of EL elements that are electrically connected in series wherein an EL element of the plurality of EL elements comprises an inorganic semiconducting material and other EL elements comprise organic EL materials.

Other features and advantages of the present invention will be apparent from a perusal of the following detailed description of the invention and the accompanying drawings in which the same numerals refer to like elements.

DETAILED DESCRIPTION OF THE INVENTION

As used herein, the term "inorganic diode element" means an electrical diode element wherein the active layer comprises an inorganic material. The term "organic EL element" means an EL element wherein the active layer that emits electromagnetic radiation upon being electrically activated comprises an organic material or an organometallic material.

Figure 1:
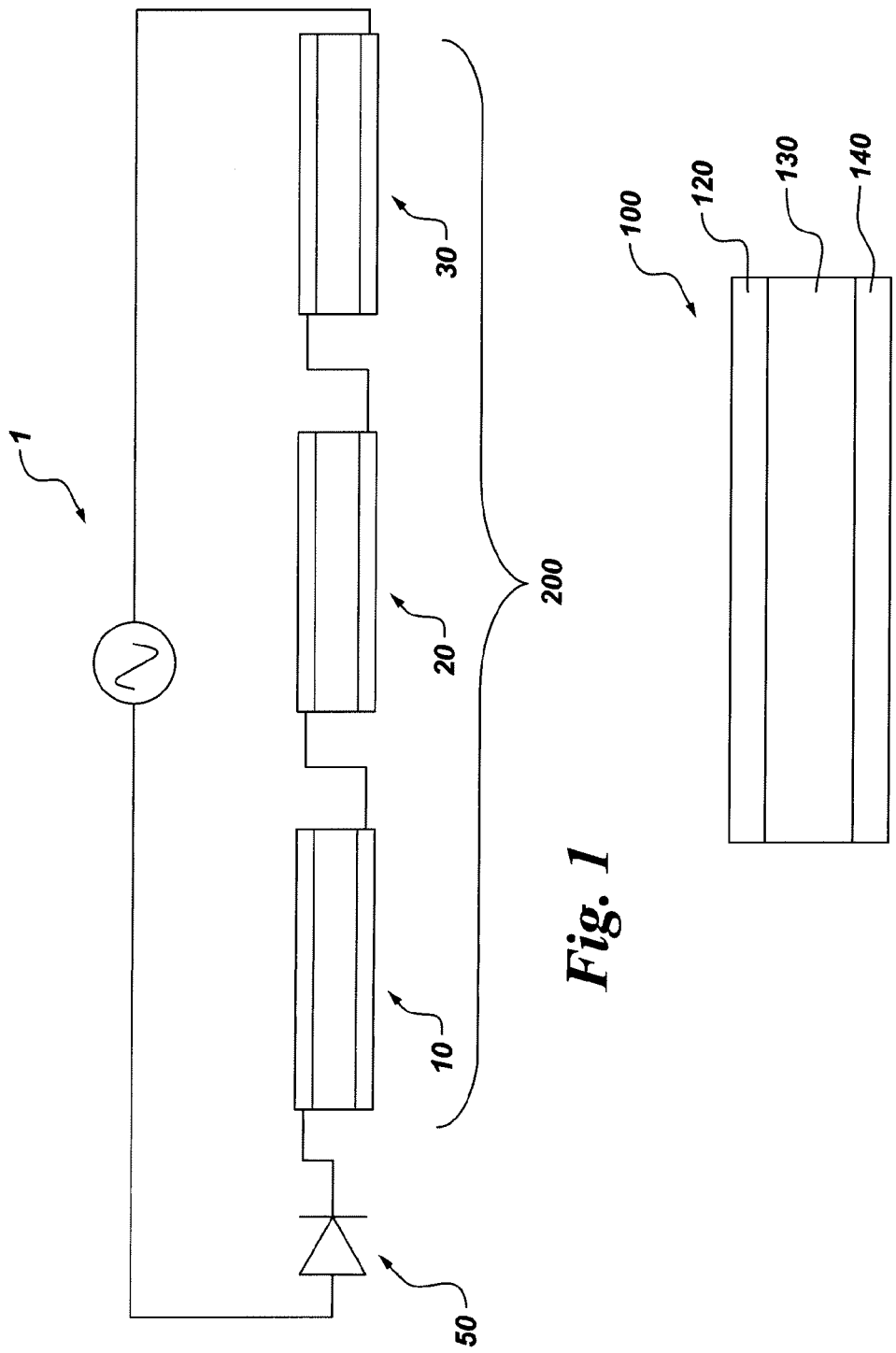
FIG. 1 shows schematically a hybrid EL device of the present invention.

In general, the present invention provides a hybrid electroluminescent device that can tolerate some imperfections in the manufacture of OELDs, wherein these imperfections allow current leakage in the reverse direction; for example, during AC operation. FIG. 1 shows schematically a hybrid EL device 1 of the present invention. Hybrid EL device 1 comprises a plurality 20 of organic EL elements (10, 20, 30) that are electrically connected in series and an inorganic diode element 50 that is electrically connected in series to the plurality 20 of organic EL elements. Inorganic diode element 50 can be a light-emitting diode or a power diode. An AC power source 70 provides power to the series of EL elements. Although FIG. 1 shows three organic EL elements for illustration purpose, any number of organic EL elements is applicable in the present invention. Organic EL elements (10, 20, 30) can comprise the same organic EL material, and thus emit the same light color. Alternatively, organic EL elements (10, 20, 30) can comprise different organic EL materials, and thus emit different light colors.

Figure 2:
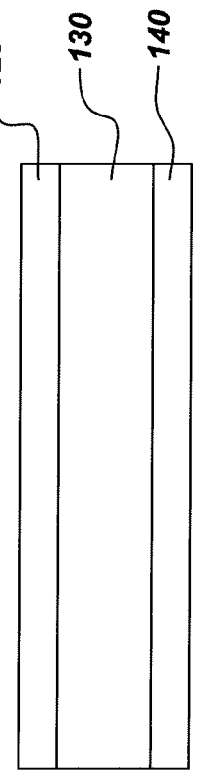
FIG. 2 shows schematically components of an organic EL element.

FIG. 2 shows schematically an organic EL element 100 that comprises an organic semiconducting EL material 130 disposed between a pair of electrically conducting materials 120 and 140. Organic EL elements are activatable to emit light at low bias voltage; e.g., less than about 5 V. Thus, many such organic EL elements can be connected electrically in series, such that the series may be conveniently operable under much higher voltage. Well-made organic EL elements electrically exhibit diode-like characteristics; i.e., near zero current flow in the reverse bias. Therefore, a series of well-made organic EL elements is expected to be operable under typical AC voltage. However, many organic EL elements allow a small finite leakage current in the reverse bias because of imperfections introduced into their structure during manufacture. Such current leakage through such imperfect organic EL elements in a series results in a large reverse voltage drop across a better-made organic EL element that does not allow for a reverse current leakage therethrough. Such large voltage drop across a single organic EL element leads to rapid failure thereof, and eventually the failure of the entire series. The present invention provides a protection for such series of organic EL elements by electrically connecting an inorganic diode element in series to the series of organic EL elements. In one aspect of the present invention, the entire voltage drop in the reverse bias occurs substantially across the inorganic diode element. Therefore, none of the organic EL elements experiences a very large voltage drop that could lead to its rapid failure.

The inorganic diode element can be a power diode, a Schottky barrier diode, or a light-emitting diode, and is chosen such that its breakdown voltage is greater than the anticipated maximum reverse voltage that is present across the whole series of EL elements. Power diodes (also known as rectifier diodes) are typically made with doped silicon semiconducting materials and can have breakdown voltage rating upwards of 5000 V. Non-limiting examples of suitable rectifier diodes to be incorporated into a hybrid EL device of the present invention are available from Texas instruments, Inc. (Dallas, Tex.). See; e.g., "The Transistor and Diode Data Book," First edition, Texas Instruments, Inc., 1973, p. 8-4. These rectifier diodes have breakdown voltage up to 1000 V and reverse current less than 10 μA at room temperature. In many applications, rectifier diodes that have breakdown voltage up to about 200 V, 250 V, or 300 V may be adequate, as long as the absolute value of the breakdown voltage is greater than the absolute value of the anticipated maximum reverse bias voltage across the series.

The inorganic diode element can be a light-emitting diode of the type made of III-V or II-VI semiconducting materials. See; e.g., A. H. Kitai (Ed.), "Solid State Luminescence," pp. 263-312, Chapman & Hall, London, 1993. It should be noted that the foregoing designations of the semiconducting materials refer to the compounds of Groups IIIB and VB, or Groups IIB and VIB of the Periodic Table, wherein the Group numbers are designated by the International Union of Pure and Applied Chemistry (IUPAC). The various layers of diodes are typically formed by well-known thin-film processing techniques, such as metal organic chemical vapor deposition or sputtering. Commercial light-emitting diodes are available from, for example, GELcore (a division of General Electric Company).

The components of an organic EL element are now described in detail.

The first electrically conducting layer 120 of organic EL element 100 can be an anode, which comprises a material having a high work function; e.g., greater than about 4.4 eV, for example from about 5 eV to about 7 eV. Indium tin oxide ("ITO") is typically used for this purpose. ITO is substantially transparent to light transmission and allows light emitted from organic EL layer 130 easily to escape through the ITO anode layer without being seriously attenuated. The term "substantially transparent" means allowing at least 50 percent, preferably at least 80 percent, and more preferably at least 90 percent, of light in the visible wavelength range transmitted through a film having a thickness of about 0.5 micrometer, at an incident angle of less than or equal to 10 degrees. Other materials suitable for use as the anode layer are tin oxide, indium oxide, zinc oxide, indium zinc oxide, zinc indium tin oxide, antimony oxide, and mixtures thereof. Still other usable materials for anode layer 120 are carbon nanotubes, or metals, such as silver or gold. Anode layer 120 may be deposited on the underlying element by physical vapor deposition, chemical vapor deposition, or sputtering. The thickness of an anode comprising such an electrically conducting oxide can be in the range from about 10 nm to about 500 nm, preferably from about 10 nm to about 200 nm, and more preferably from about 50 nm to about 200 nm. A thin, substantially transparent layer of a metal is also suitable; for example, a layer having a thickness less than about 50 nm, preferably less than about 20 nm. Suitable metals for anode 120 are those having high work function, such as greater than about 4.4 eV, for example, silver, copper, tungsten, nickel, cobalt, iron, selenium, germanium, gold, platinum, aluminum, or mixtures thereof or alloys thereof. In one embodiment, it may be desirable to dispose anode 120 on a substantially transparent substrate, such as one comprising glass or a polymeric material.

The second electrically conducting layer 140 of organic EL element 100 can be a cathode, which injects negative charge carriers (electrons) into organic EL layer 130 and is made of a material having a low work function; e.g., less than about 4 eV. Low-work function materials suitable for use as a cathode are K, Li, Na, Mg, Ca, Sr, Ba, Al, Ag, Au, In, Sn, Zn, Zr, Sc, Y, elements of the lanthanide series, alloys thereof, or mixtures thereof. Suitable alloy materials for the manufacture of cathode layer 140 are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, KF, or NaF, covered by a thicker layer of some other metal, such as aluminum or silver. Cathode 140 may be deposited on the underlying element by physical vapor deposition, chemical vapor deposition, or sputtering. The Applicants unexpectedly discovered that an electron-donating material chosen from among those disclosed above lowered the work function of cathode materials, thus reducing the barrier for electron injection and/or transport into organic EL material 130. Preferably, cathode 140 (or 240) is substantially transparent. In some circumstances, it may be desirable to provide a substantially transparent cathode that is made of a material selected from the group consisting of ITO, tin oxide, indium oxide, zinc oxide, indium zinc oxide, zinc indium tin oxide, antimony oxide, and mixtures thereof. These oxides are substantially transparent. In these circumstances, the thickness of cathode 140 can be from about 10 nm to about 2000 nm. Preferably, the thickness can be from about 10 nm to about 1000 nm. More preferably, the thickness can be from about 50 nm to about 500 nm. Materials such as carbon nanotubes may also be used as cathode material.

Organic EL layer 130 serves as the transport medium for both holes and electrons. In this layer these excited species combine and drop to a lower energy level, concurrently emitting EM radiation in the visible range. Organic EL materials are chosen to electroluminesce in the desired wavelength range. The thickness of the organic EL layer 130 is preferably kept in the range of about 100 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable EL polymers are poly (N-vinylcarbazole) ("PVK", emitting violet-to-blue light in the wavelengths of about 380-500 nm) and its derivatives; polyfluorene and its derivatives such as poly(alkylfluorene), for example poly(9,9-dihexylfluorene) (410-550 nm), poly (dioctylfluorene) (wavelength at peak EL emission of 436 nm) or poly{9,9-bis(3,6-dioxaheptyl)-fluorene-2,7-diyl} (400-550 nm); poly(praraphenylene) ("PPP") and its derivatives such as poly(2-decyloxy-1,4-phenylene) (400-550 nm) or poly(2,5-diheptyl-1,4-phenylene); poly(p-phenylene vinylene) ("PPV") and its derivatives such as dialkoxy-substituted PPV and cyano-substituted PPV; polythiophene and its derivatives such as poly(3-alkylthiophene), poly(4,4'-dialkyl-2,2'-biothiophene), poly(2,5-thienylene vinylene); poly (pyridine vinylene) and its derivatives; polyquinoxaline and its derivatives; and poly quinoline and its derivatives. Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane}, which are disclosed in H. Suzuki et al., "Near-Ultraviolet Electroluminescence From Polysilanes," Thin Solid Films, Vol. 331, 64-70 (1998). These polysilanes emit light having wavelengths in the range from about 320 nm to about 420 nm.

Organic materials having molecular weight less than, for example, about 5000 that are made of a large number of aromatic units are also applicable. An example of such materials is 1,3,5-tris{n-(4-diphenylaminophenyl) phenylamino}benzene, which emits light in the wavelength range of 380-500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415-457 nm, aluminum-(picolymethylketone)-bis{2,6-di(t-butyl) phenoxide} or scandium-(4-methoxy-picolylmethylketone)-bis(acetylacetonate), which emits in the range of 420-433 nm. For white light application, the preferred organic EL materials are those emit light in the blue-green wavelengths.

Other suitable organic EL materials that emit in the visible wavelength range are organo-metallic complexes of 8-hydroxyquinoline, such as tris(8-quinolinolato)aluminum and its derivatives. Other non-limiting examples of organic EL materials are disclosed in U. Mitschke and P. Bauerle, "The Electroluminescence of Organic Materials," J. Mater. Chem., Vol. 10, pp. 1471-1507 (2000).

An organic EL material is deposited on the underlying layer (e.g., an electrode layer) by physical or chemical vapor deposition, spin coating, dip coating, spraying, ink-jet printing, gravure coating, flexo-coating, screen printing, or casting, followed by polymerization, if necessary, or curing of the material. The organic EL material may be diluted in a solvent to adjust its viscosity or mixed with another polymeric material that serves as a film-forming vehicle.

Figure 3:
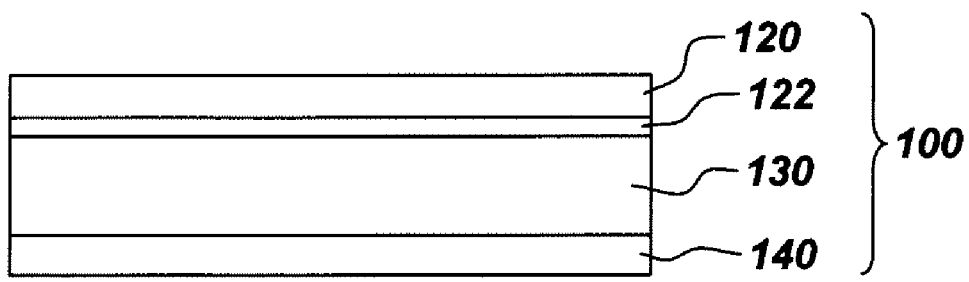
FIG. 3 shows schematically an organic EL element having a hole injection layer.

Furthermore, one or more additional layers may be included in light-emitting element 100 further to increase the efficiency thereof. For example, an additional layer can serve to improve the injection and/or transport of positive charges (holes) into the organic EL layer 130. The thickness of each of these layers is kept to below 500 nm, preferably below 100 nm. Suitable materials for these additional layers are low-to-intermediate molecular weight (for example, less than about 2000) organic molecules, poly(3,4-ethylenedioxythipohene) ("PEDOT"), and polyaniline. They may be applied during the manufacture of the element 100 by conventional methods such as spray coating, dip coating, gravure coating, flexo-coating, screen printing, or physical or chemical vapor deposition. In one embodiment of the present invention, as shown in FIG. 3, a hole injection enhancement layer 122 is formed between the anode layer 120 and the organic EL layer 130 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9, 10-perylenetetra-carboxylic dianhydride or bis(1,2,5-thiadiazolo)-p-quinobis(1,3-dithiole).

Figure 4:
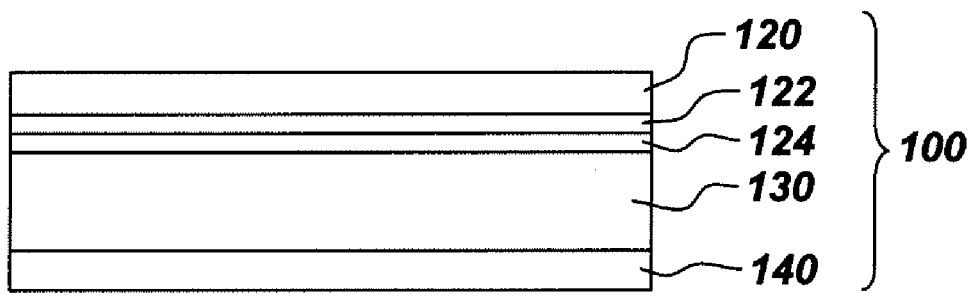
FIG. 4 shows schematically an organic EL element having a hole transport layer and a hole injection layer.

FIG. 4, organic light-emitting element 100 further includes a hole transport layer 124 which is disposed between the hole injection enhancement layer 122 and the organic EL layer 130. The hole transport layer 124 has the functions of transporting holes and blocking the transportation of electrons so that holes and electrons are optimally combined in the organic EL layer 130. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Figure 5:
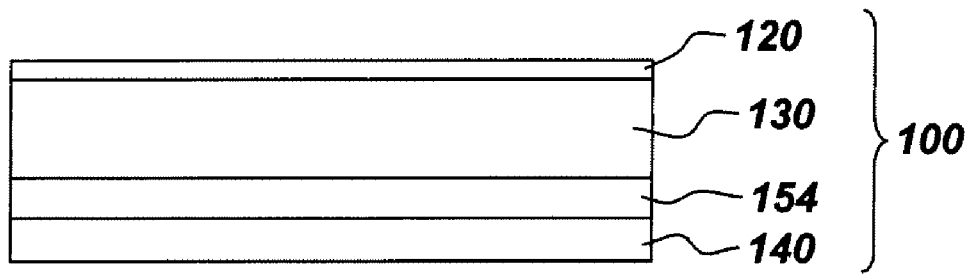
FIG. 5 shows schematically an organic EL element having an electron injecting and transporting enhancement layer.

In still another embodiment of the present invention, as shown schematically in FIG. 5, light-emitting element 100 includes an additional layer 154 which can be disposed between cathode 140 and organic EL layer 130. Layer 154 can further enhance the injection and transport of electrons (hereinafter called "electron injecting and transporting enhancement layer") to organic EL layer 130. Materials suitable for the electron injecting and transporting enhancement layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

Twenty rows, each comprising twelve organic EL elements electrically connected in series, were connected to a variable peak voltage AC power source. Fifteen rows rapidly failed because of reverse current leakage. Some of these rows failed at relatively low reverse voltage of 30 V across the entire row. The experiment was repeated, wherein a General Electric silicon power diode (catalog number GE 1N5626) was electrically connected to each series of twelve organic EL elements. Each entire series was powered with an AC power source having a peak voltage of greater than 48 V. None of the series failed. Upon removing the silicon power diode from each series and reapplying the AC voltage, eight series rapidly failed. Thus, it was demonstrated that a hybrid EL device of the present invention comprising an inorganic diode element electrically connected in series with a plurality of organic EL elements that are also electrically connected in series can be operated under AC power without being impacted by reverse current leakage through the series.

In another aspect of the present invention, a method of making an EL device comprises: (a) providing a plurality of organic EL elements that are electrically connected in series; and (b) connecting an inorganic diode electrically in series to the plurality of organic EL elements. Each of the organic EL elements can comprise a different organic EL material to emit a different light color upon activation. Furthermore, each of the organic EL elements can have a different shape so that they may be arranged to depict an image, or to present a message.

In still another aspect of the present invention, a method for generating light comprises providing an AC power to a plurality of EL elements that are electrically connected in series wherein an EL element of the plurality of EL elements comprises an inorganic semiconducting material and other EL elements comprise organic EL materials. The AC power can have the typical voltage of about 110-120 V and frequency of 60 Hz. Other AC power frequencies can be used if desired to provide a flashing effect. Alternatively, AC power having different maximum voltages can be applied to the series, depending on the number of organic EL elements in the series and their electrical characteristics.

Furthermore, light emitted from a hybrid EL device of the present invention may be modified by disposing a photoluminescent material (or phosphor) in the path of light emitted by the organic EL elements. Such modification can convert light from one color (such as blue light emitted by many organic EL material) to another color (such as white light), by employing one or more phosphors emitting the appropriate light color or colors.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. An electroluminescent ("EL") device comprising a plurality of organic EL elements electrically connected in series with at least one inorganic diode element.

2. The EL device of claim 1, wherein each organic EL element comprises an organic EL material disposed between a pair of electrically conducting materials.

3. The EL device of claim 2, wherein one of the electrically conducting material is an anode and comprises a material selected from the group consisting of indium tin oxide, tin oxide, indium oxide, zinc oxide, indium zinc oxide, zinc indium tin oxide, antimony oxide, carbon nanotubes, silver, gold, and mixtures thereof.

4. The EL device of claim 2, wherein one of the electrically conducting material is a cathode and comprises a material selected from the group consisting of K, Li, Na, Mg, Ca, Sr, Ba, Al, Ag, Au, In, Sn, Zn, Zr, Sc, Y, elements of the lanthanide series, alloys thereof, mixtures thereof, Ag—Mg alloy, Al—Li alloy, In—Mg alloy, Al—Ca alloy, LiF, KF, and NaF.

5. The EL device of claim 4, wherein the cathode is a layer having a thickness from about 1 nm to about 10 nm.

6. The EL device of claim 5, wherein the cathode is a layer having a thickness from about 10 nm to about 2000 nm.

7. The EL device of claim 2, wherein one of the electrically conducting material is a cathode and comprises a material selected from the group consisting of indium tin oxide, tin oxide, indium oxide, zinc oxide, indium zinc oxide, zinc indium tin oxide, antimony oxide, carbon nanotubes, and mixtures thereof.

8. The EL device of claim 2, wherein the organic EL material comprises a material selected from the group consisting of poly(n-vinylcarbazole); polyfluorene; poly(alkylfluorene); poly(praraphenylene); poly(p-phenylene vinylene); polythiophene; poly(pyridine vinylene); polyquinoxaline; poly(quinoline); and derivatives thereof.

9. The EL device of claim 2, wherein the organic EL material comprises polysilane.

10. The EL device of claim 9, wherein the polysilane is selected from the group consisting of poly(di-n-butylsilane), poly(di-n-pentylsilane), poly(di-n-hexylsilane), poly(methylphenylsilane), and poly{bis(p-butylphenyl)silane}.

11. The EL device of claim 2, wherein the organic EL material comprises a material selected from the group consisting of organo-metallic complexes of 8-hydroxyquinoline, aluminum-acetylacetonate, gallium-acetylacetonate, and indium-acetylacetonate, aluminum-(picolymethylketone)-bis{2,6-di(t-butyl)phenoxide}, scandium-(4-methoxy-picolylmethylketone)-bis(acetylacetonate), and mixtures thereof.

12. The EL device of claim 1, wherein said at least one inorganic diode element is selected from the group consisting of power diodes, Schottky barrier diodes, and light-emitting diodes.

13. The EL device of claim 1, wherein said at least one inorganic diode element has an absolute value of a breakdown voltage that is greater than an absolute value of a maximum reverse bias voltage that is applied across an entire series of all EL elements.

14. The EL device of claim 13, wherein the absolute value of the breakdown voltage is about 250 V.

15. The EL device of claim 1, wherein said at least one inorganic diode element is a power diode, an electronically active layer of which comprises silicon.

16. The EL device of claim 1, wherein said at least one inorganic diode element is a light-emitting diode, an electronically active layer of which comprises a material selected from the group consisting of III-V and II-VI semiconducting material.

17. The EL device of claim 1, wherein a series of said at least one inorganic diode element and said plurality of organic EL elements is activated with an AC power source.

18. The EL device of claim 17, wherein an organic EL material of one organic EL element is the same as an organic EL material of another organic EL element.

19. The EL device of claim 17, wherein an organic EL material of one organic EL element is different from an organic EL material of another organic EL element.

20. A method for generating light comprising providing an AC power to a plurality of semiconducting elements that are electrically connected in series, wherein a semiconducting element of the plurality of semiconducting elements comprises an inorganic semiconducting material, and other semiconducting elements comprise organic EL materials.

21. The method of claim 20, wherein an absolute value of a maximum voltage the AC power is less than an absolute value of a breakdown voltage of the inorganic diode element.

* * * * *